(12) United States Patent
Kim

(10) Patent No.: US 8,941,210 B2
(45) Date of Patent: Jan. 27, 2015

(54) SEMICONDUCTOR DEVICES HAVING A TRENCH ISOLATION LAYER AND METHODS OF FABRICATING THE SAME

(71) Applicant: SK Hynix Inc., Icheon-si Gyeonggi-do (KR)

(72) Inventor: Tai Ho Kim, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/445,291

(22) Filed: Jul. 29, 2014

(65) Prior Publication Data

US 2014/0332921 A1    Nov. 13, 2014

Related U.S. Application Data

(62) Division of application No. 13/616,951, filed on Sep. 14, 2012, now Pat. No. 8,823,131.

(30) Foreign Application Priority Data

Jan. 30, 2012 (KR) .................. 10-2012-0009197

(51) Int. Cl.
*H01L 21/70* (2006.01)
*H01L 29/04* (2006.01)
*H01L 21/8242* (2006.01)
*H01L 21/76* (2006.01)
*H01L 29/06* (2006.01)

(52) U.S. Cl.
CPC .................. *H01L 29/0649* (2013.01)
USPC ................ 257/506; 257/3; 438/243; 438/437

(58) Field of Classification Search
CPC .............. H01L 21/762; H01L 29/06
USPC .......... 257/3, 506, E21.549, E29.02; 438/437
See application file for complete search history.

(56) References Cited

U.S. PATENT DOCUMENTS

| | | | | |
|---|---|---|---|---|
| 6,077,739 A | * | 6/2000 | Chang | 438/243 |
| 6,251,722 B1 | * | 6/2001 | Wei et al. | 438/243 |
| 6,297,121 B1 | * | 10/2001 | Tseng | 438/393 |
| 2002/0167045 A1 | * | 11/2002 | Short | 257/330 |
| 2003/0080367 A1 | * | 5/2003 | Goldbach et al. | 257/301 |
| 2008/0318441 A1 | * | 12/2008 | Paranjpe et al. | 438/784 |

FOREIGN PATENT DOCUMENTS

| | | |
|---|---|---|
| KR | 1020040061263 A | 7/2004 |
| KR | 1020050003011 A | 1/2005 |
| KR | 1020050063266 A | 6/2005 |

(Continued)

*Primary Examiner* — Long K Tran
*Assistant Examiner* — Dzung Tran
(74) *Attorney, Agent, or Firm* — William Park & Associates Patent Ltd.

(57) ABSTRACT

Semiconductor devices including a trench isolation layer are provided. The semiconductor device includes a substrate having a trench therein, a liner insulation layer that covers a bottom surface and sidewalls of the trench and includes micro trenches located at bottom inner corners of the liner insulation layer, a first isolating insulation layer filling the micro trenches and a lower region of the trench that are surrounded by the liner insulation layer, and a second isolating insulation layer filling the trench on the first isolating insulation layer. The liner insulation layer on sidewalls of an upper region of the trench having a thickness that gradually increases toward a bottom surface of the trench, and the liner insulation layer on sidewalls of the lower region of the trench having a thickness that is uniform. Related methods are also provided.

6 Claims, 12 Drawing Sheets

(56) References Cited

FOREIGN PATENT DOCUMENTS

| KR | 1020060122414 A | 11/2006 |
| KR | 1020080030285 A | 4/2008 |
| KR | 1020090047681 A | 5/2009 |
| KR | 1020100063061 A | 6/2010 |

* cited by examiner

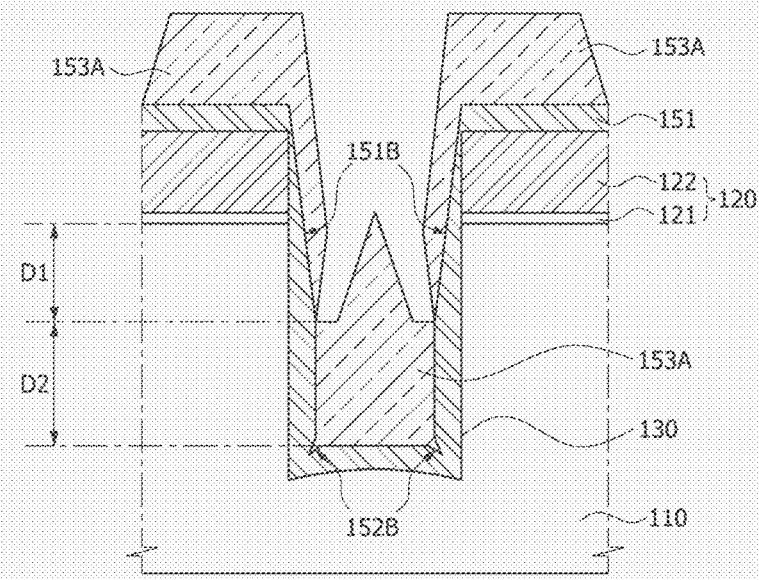
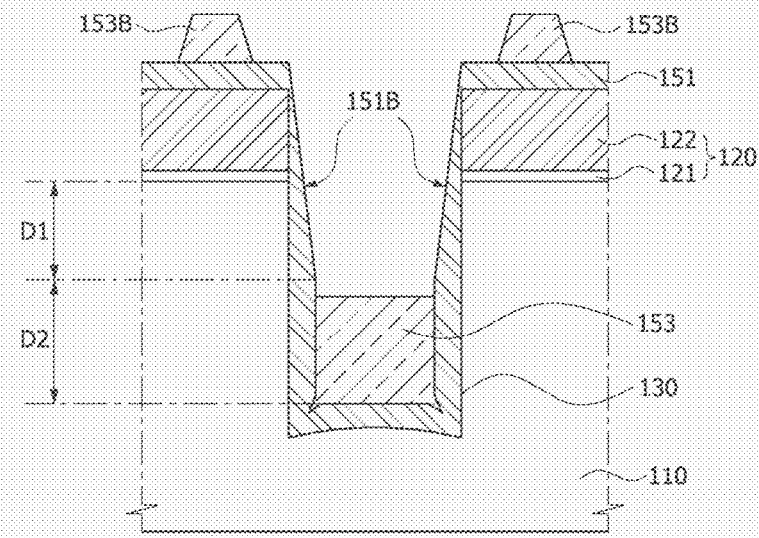

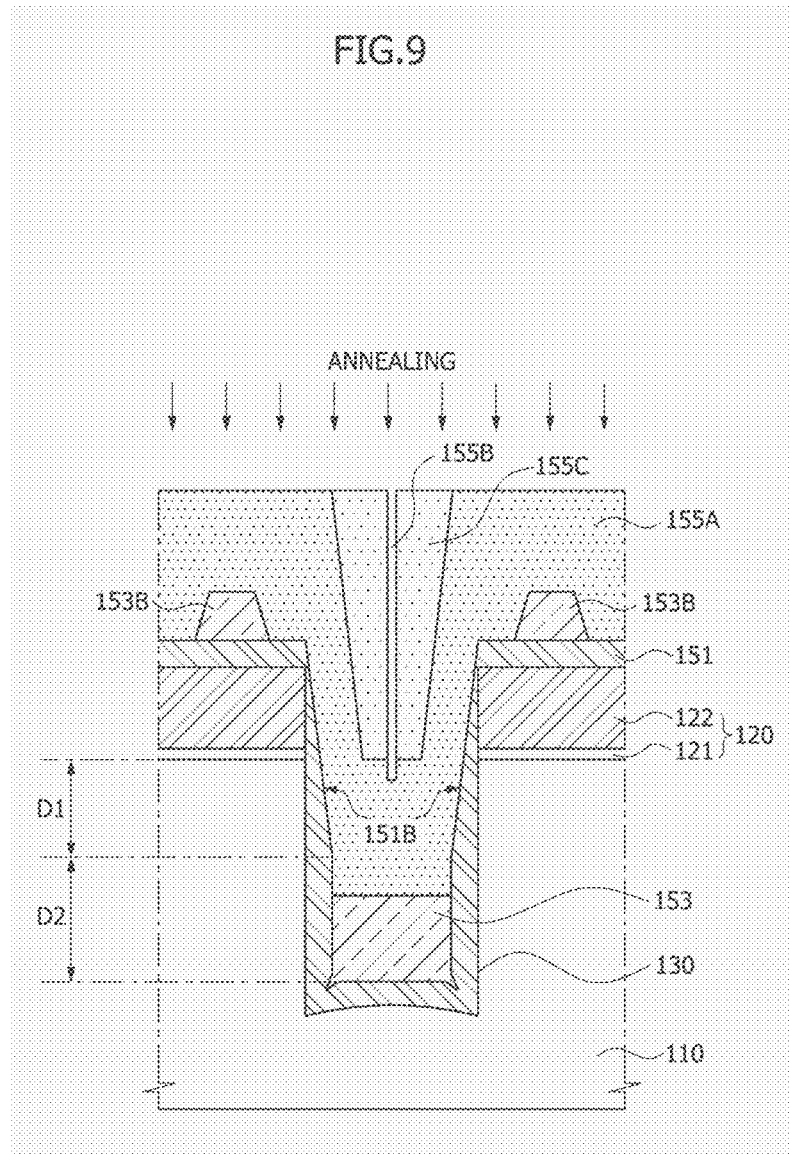

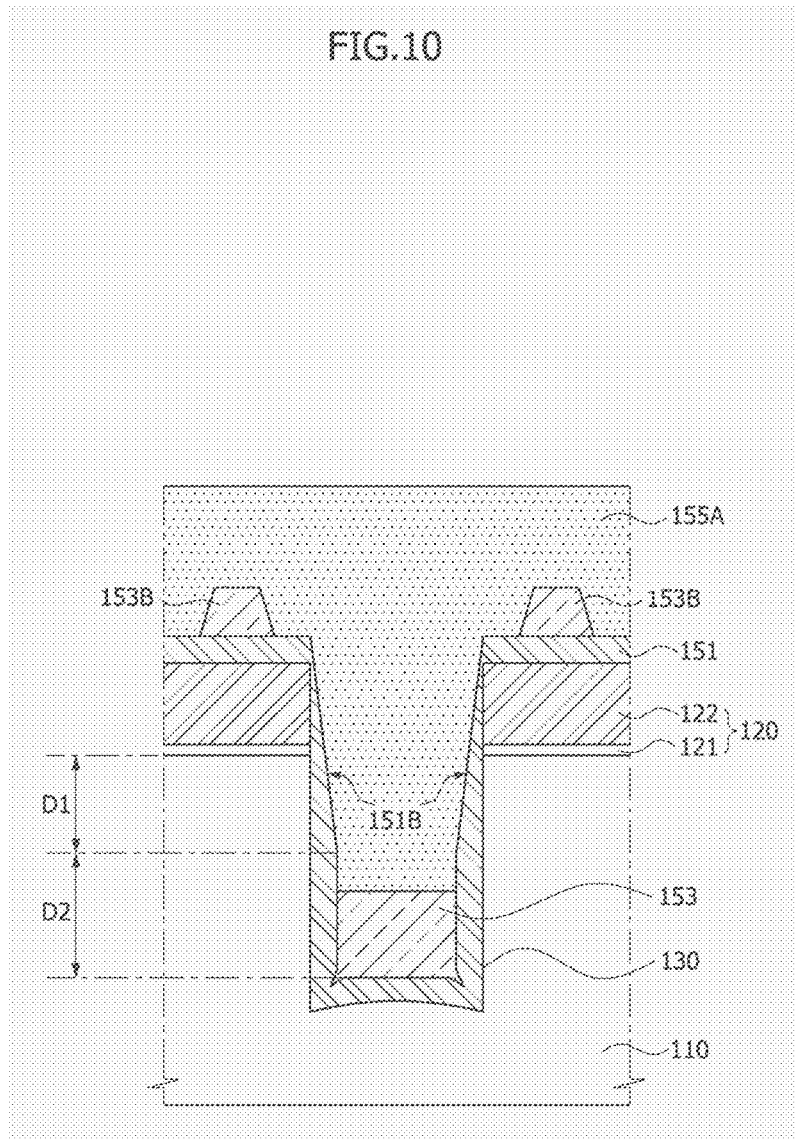

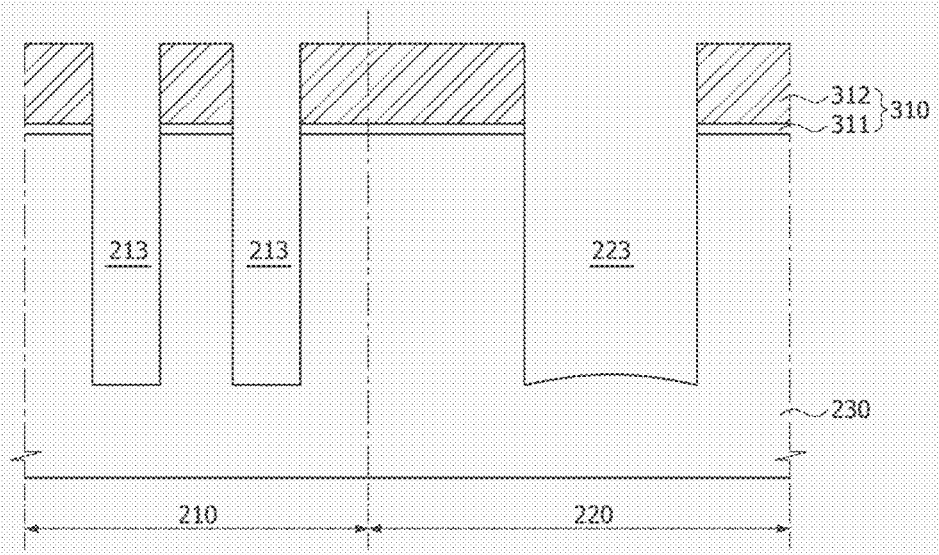
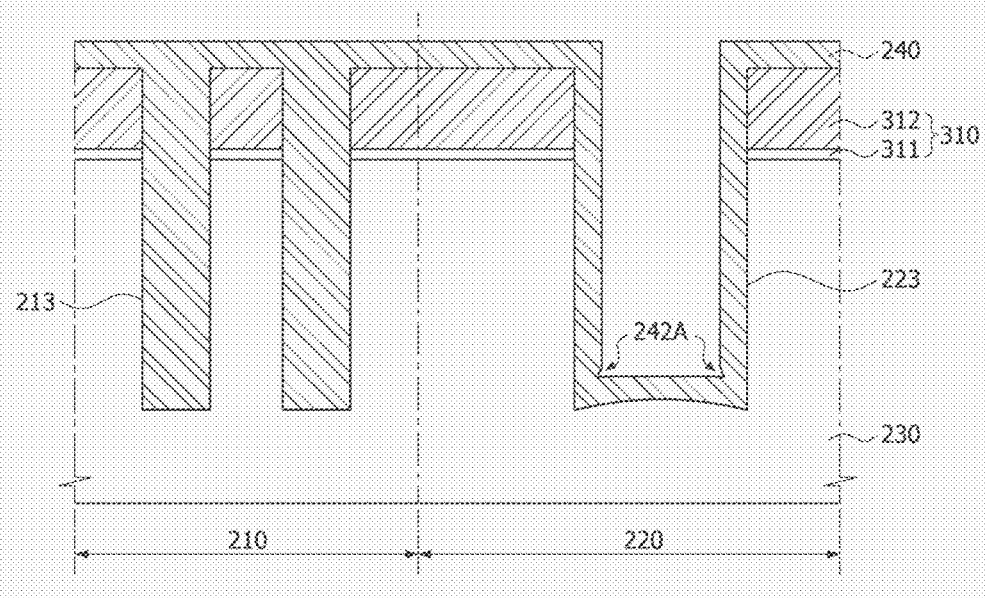

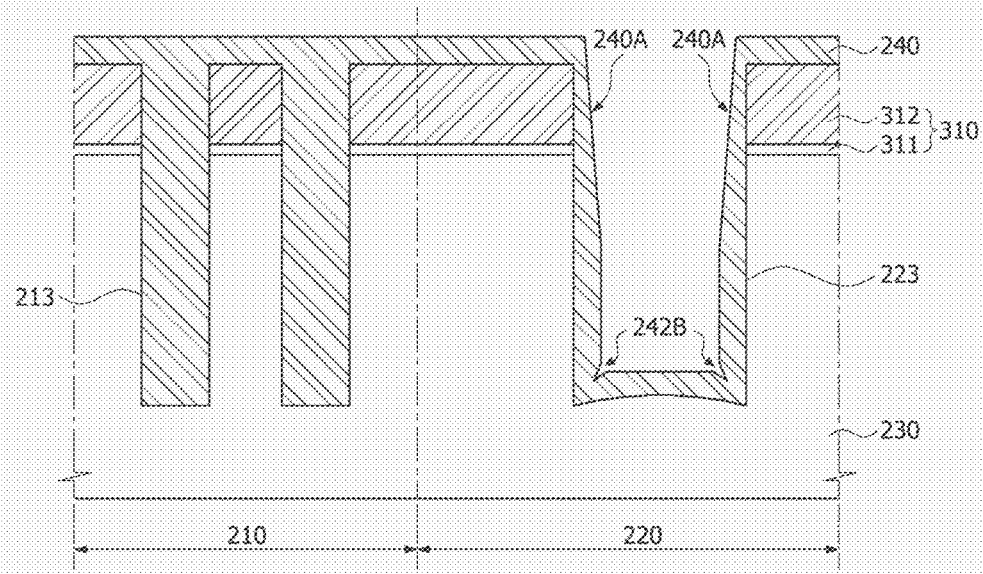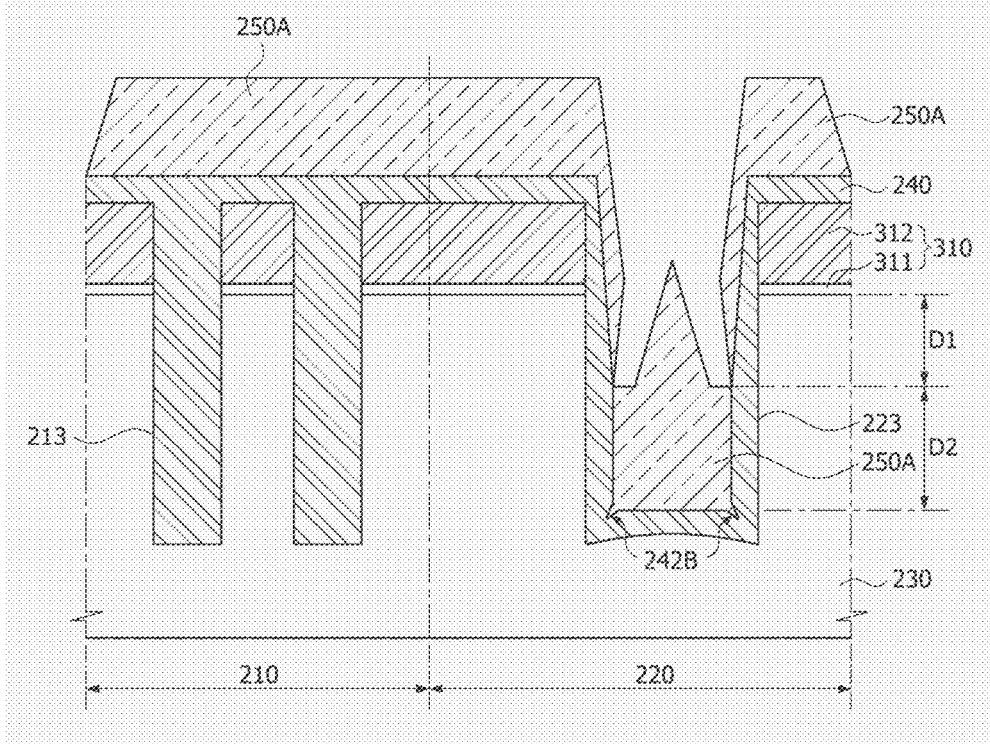

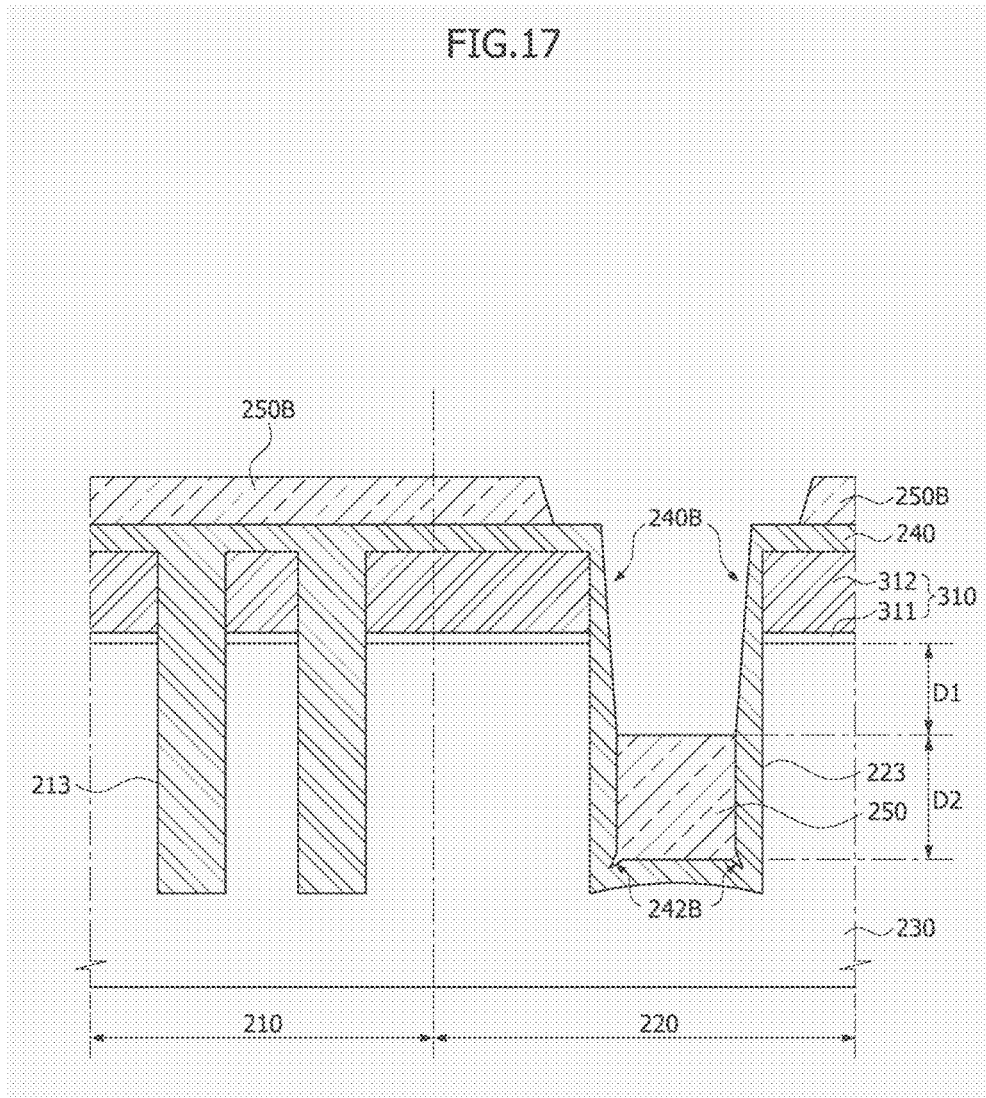

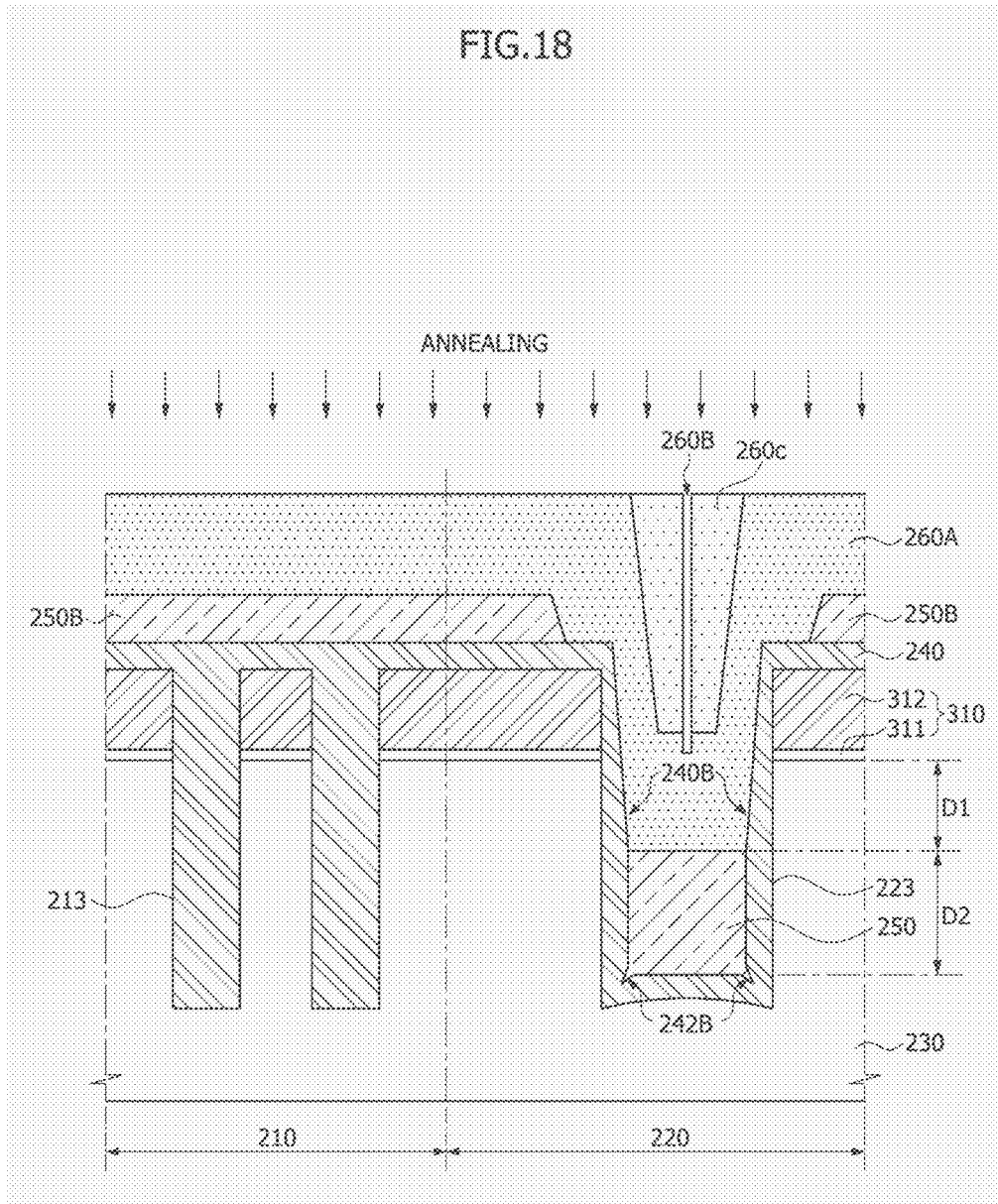

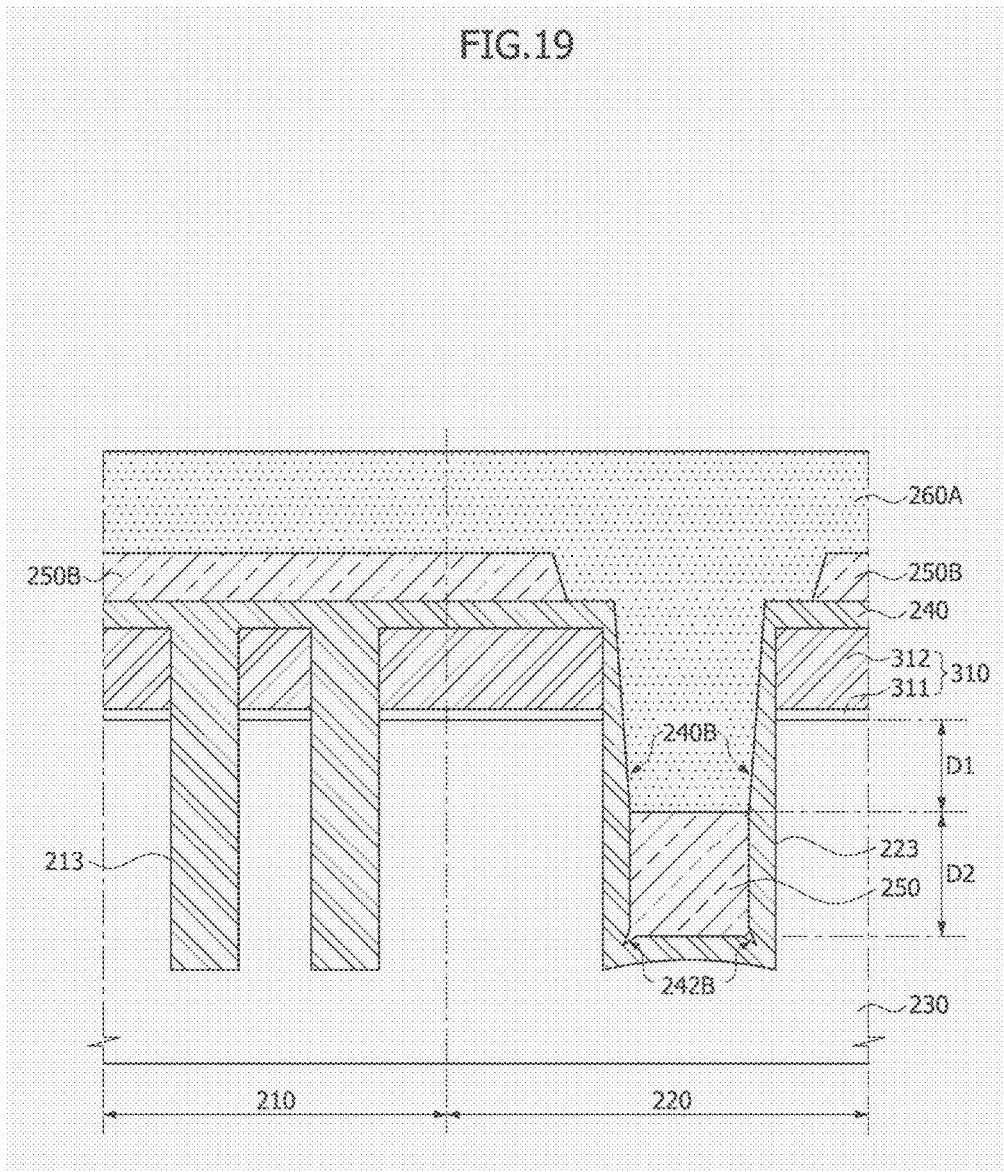

SEMICONDUCTOR DEVICES HAVING A TRENCH ISOLATION LAYER AND METHODS OF FABRICATING THE SAME

CROSS-REFERENCES TO RELATED APPLICATIONS

The present application claims priority under 35 U.S.C 119(a) to Korean Application No. 10-2012-0009197, filed on Jan. 30, 2012, in the Korean intellectual property Office, which is incorporated by reference herein in its entirety as set forth in full.

BACKGROUND

1. Field of the Invention

Example embodiments of the present disclosure relate to semiconductor devices and methods of fabricating the same and, more particularly, to semiconductor devices having a trench isolation layer and methods of fabricating the same.

2. Description of the Related Art

As semiconductor devices become more integrated, design rules of circuit patterns have been reduced. Accordingly, isolation layers of semiconductor devices continuously shrink. That is, the isolation layers having ultra-fine sizes are increasingly demanded to realize highly integrated semiconductor devices. However, when design rules of semiconductor devices such as dynamic random access memory (DRAM) devices are reduced to about 30 nanometers or less, voids and/or seams may be formed in shallow trench isolation (STI) layers of the semiconductor devices. Thus, isolation techniques for forming the isolation layers without any voids and/or seams have been increasingly demanded to fabricate high reliable semiconductor devices.

Recently, methods of forming isolation layers with a spin on dielectric (SOD) layer or a flowable oxide layer have been proposed to obtain excellent isolation layers without voids and/or seams. However, the SOD layer may contain impurities such as carbon hydride (CH) and the flowable oxide layer may contain impurities such as nitrogen hydride (NH). Thus, during removal of the nitride hydride (NH) or the carbon hydride (CH), the SOD layer or the flowable oxide layer may shrink and/or increase in density. That is, a volume of the SOD layer or the flowable oxide layer may be reduced after removal of the impurities therein. The reduction of the volume of the SOD layer or the flowable oxide layer may cause a stress, thereby generating crystalline defects in a substrate (or a wafer) adjacent to the SOD layer or the flowable oxide layer. Further, if the stress of the SOD layer or the flowable oxide layer increases, the wafer may warp.

SUMMARY

Example embodiments are directed to semiconductor devices having a trench isolation layer and methods of fabricating the same.

According to some embodiments, a semiconductor device includes a substrate having a trench therein, a liner insulation layer covering a bottom surface and sidewalls of the trench and including micro trenches located at bottom inner corners of the liner insulation layer, a first isolating insulation layer filling the micro trenches and a lower region of the trench that are surrounded by the liner insulation layer, and a second isolating insulation layer filling the trench on the first isolating insulation layer. The liner insulation layer on sidewalls of an upper region of the trench may have a thickness that gradually increases toward a bottom surface of the trench, and the liner insulation layer on sidewalls of the lower region of the trench may have a uniform thickness.

The liner insulation layer may include a nitride layer.

A top surface of the first isolating insulation layer may be located in the lower region of the trench.

The first isolating insulation layer may include a high density plasma (HDP) oxide layer.

The second isolating insulation layer may include an ozone tetra-ethyl-ortho-silicate ($O_3$ TEOS) layer.

According to some other embodiments, a semiconductor device includes a substrate having a first trench and a second trench wider than the first trench, and a liner insulation layer filling the first trench, covering a bottom surface and sidewalls of the second trench, and including micro trenches located at bottom inner corners of the liner insulation layer in the second trench. The liner insulation layer on sidewalls of an upper region of the second trench may have a thickness that gradually increases toward a bottom surface of the second trench, and the liner insulation layer on sidewalls of a lower region of the second trench may have a thickness that is substantially uniform. A first isolating insulation layer is disposed to fill the micro trenches and a lower region of the second trench that are surrounded by the liner insulation layer. A second isolating insulation layer is disposed to fill the second trench on the first isolating insulation layer.

The first trench may be disposed in a cell region of the substrate and the second trench may be disposed in a peripheral circuit region of the substrate.

The liner insulation layer may include a nitride layer.

A top surface of the first isolating insulation layer may be located in the lower region of the second trench.

The first isolating insulation layer may include a high density plasma (HDP) oxide layer.

The second isolating insulation layer may include an ozone tetra-ethyl-ortho-silicate ($O_3$ TEOS) layer.

According to some other embodiments, a method of fabricating a semiconductor device includes forming a trench in a substrate, forming a liner insulation layer on a bottom surface and sidewalls of the trench, and forming a first isolating insulation layer on the liner insulation layer. During formation of the first isolating insulation layer, the liner insulation layer is deformed such that the liner insulation layer on sidewalls of an upper region of the trench may have a thickness that gradually increases toward a bottom surface of the trench and such that micro trenches are formed at bottom inner corners of the liner insulation layer in the trench. The first isolating insulation layer is formed to fill the micro trenches and at least a lower region of the trench. A second isolating insulation layer on the first isolating insulation layer is formed to fill the remaining trench surrounded by the first isolating insulation layer.

The liner insulation layer may be formed of a nitride layer.

The first isolating insulation layer may be formed of a high density plasma (HDP) oxide layer. Forming the high density plasma (HDP) oxide layer may include etching top corners and bottom inner corners of the liner insulation layer in the trench to form a sloped profile in an upper region of the trench and to form micro trenches at the bottom inner corners of the liner insulation layer in the trench, and depositing a high density plasma (HDP) oxide layer on the etched liner insulation layer. Etching the liner insulation layer and depositing the high density plasma (HDP) oxide layer may be performed using a high density plasma (HDP) apparatus.

Etching the liner insulation layer may be performed with a bias power of about 1000 watts to about 2000 watts.

Depositing the high density plasma (HDP) oxide layer may include the steps of a) initially etching the liner insulation layer to form an inclined sidewall profile in the upper region of the trench and initially depositing a high density plasma (HDP) oxide layer on the etched liner insulation layer to fill at least a lower region of the trench surrounded by the liner insulation layer, b) subsequently etching the high density plasma (HDP) oxide layer and subsequently depositing a high density plasma (HDP) oxide layer, and c) repeatedly alternating performing the step of subsequently etching the high density plasma (HDP) oxide layer and the step of subsequently depositing the high density plasma (HDP) oxide layer.

Initially etching the liner insulation layer may be performed with a bias power of about 1500 watts to about 5000 watts.

Subsequently etching the high density plasma (HDP) oxide layer may be performed with a bias power of about 500 watts to about 1000 watts.

Subsequently depositing the high density plasma (HDP) oxide layer may be performed with a bias power of about 900 watts to about 1500 watts.

The second isolating insulation layer may be formed of an ozone tetra-ethyl-ortho-silicate ($O_3$ TEOS) layer. The ozone ($O_3$) TEOS layer may be formed under a pressure of about 300 torr to about 600 torr and at a temperature of about 400° C. to about 550° C.

The method may further include performing a cleaning process to remove the first isolating insulation layer on sidewalls of the liner insulation layer in the upper region of the trench and to remove a protrusion that protrudes upwardly from the first isolating insulation layer in the lower region of the trench, before the second isolating insulation layer is formed.

The method may further include applying an annealing process to the substrate including the second isolating insulation layer, thereby densifying the second isolating insulation layer. The annealing process may be performed using a nitrogen gas or water vapor as an ambient gas at a temperature of about 700° C. to about 1000° C.

According to some other embodiments, a method of fabricating a semiconductor device includes forming a first trench and a second trench wider than the first trench in a substrate, forming a liner insulation layer filling the first trench and covering a bottom surface and sidewalls of the second trench, and forming a first isolating insulation layer on the liner insulation layer. During formation of the first isolating insulation layer, the liner insulation layer is deformed such that the liner insulation layer on sidewalls of an upper region of the second trench has a thickness that gradually increases toward a bottom surface of the second trench and such that micro trenches are formed at bottom inner corners of the liner insulation layer in the second trench. The first isolating insulation layer is formed to fill the micro trenches and at least a lower region of the second trench. A second isolating insulation layer is formed on the first isolating insulation layer to fill at least the remaining second trench.

The first trench may be formed in a cell region of the substrate and the second trench may be formed in a peripheral circuit region of the substrate.

The liner insulation layer may be formed of a nitride layer.

The first isolating insulation layer may be formed of a high density plasma (HDP) oxide layer. Forming the high density plasma (HDP) oxide layer may include etching top corners and bottom inner corners of the liner insulation layer in the second trench to form a sloped profile in an upper region of the second trench and to form micro trenches at the bottom inner corners of the liner insulation layer in the second trench, and depositing a high density plasma (HDP) oxide layer on the etched liner insulation layer. Etching the liner insulation layer and depositing the high density plasma (HDP) oxide layer may be performed using a high density plasma (HDP) apparatus.

Etching the liner insulation layer may be performed with a bias power of about 1000 watts to about 2000 watts.

Depositing the high density plasma (HDP) oxide layer may include the steps of a) initially etching the liner insulation layer to form an inclined sidewall profile in the upper region of the second trench and initially depositing a high density plasma (HDP) oxide layer on the etched liner insulation layer to fill at least a lower region of the second trench surrounded by the liner insulation layer, b) subsequently etching the high density plasma (HDP) oxide layer and subsequently depositing a high density plasma (HDP) oxide layer, and c) repeatedly alternating performing the step of subsequently etching the high density plasma (HDP) oxide layer and the step of subsequently depositing the high density plasma (HDP) oxide layer.

Initially etching the liner insulation layer may be performed with a bias power of about 1500 watts to about 5000 watts. Subsequently etching the high density plasma (HDP) oxide layer may be performed with a bias power of about 500 watts to about 1000 watts. Subsequently depositing the high density plasma (HDP) oxide layer may be performed with a bias power of about 900 watts to about 1500 watts.

The second isolating insulation layer may be formed of an ozone tetra-ethyl-ortho-silicate ($O_3$ TEOS) layer. The ozone ($O_3$) TEOS layer may be formed under a pressure of about 300 torr to about 600 torr and at a temperature of about 400° C. to about 550° C.

The method may further include performing a cleaning process to remove the first isolating insulation layer on sidewalls of the liner insulation layer in the upper region of the second trench and to remove a protrusion that protrudes upwardly from the first isolating insulation layer in the lower region of the second trench, before the second isolating insulation layer is formed.

The method may further include applying an annealing process to the substrate including the second isolating insulation layer, thereby densifying the second isolating insulation layer.

The annealing process may be performed using a nitrogen gas or water vapor as an ambient gas at a temperature of about 700° C. to about 1000° C.

BRIEF DESCRIPTION OF THE DRAWINGS

Embodiments of the inventive concept will become more apparent in view of the attached drawings and accompanying detailed description, where:

FIGS. 3 to 10 are cross sectional views illustrating a method of fabricating a semiconductor device having a trench isolation layer of FIG. 1;

FIGS. 12 to 19 are cross sectional views illustrating a method of fabricating a semiconductor device having a trench isolation layer shown in FIG. 2.

DETAILED DESCRIPTION OF THE EMBODIMENTS

Figure 1:
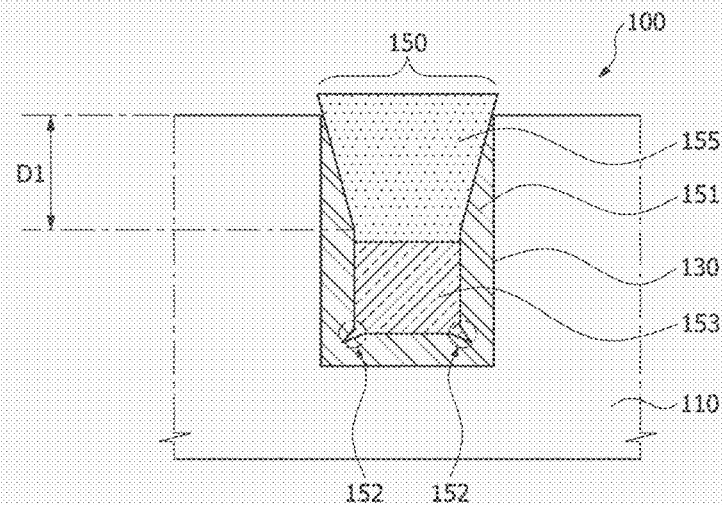
FIG. 1 is a cross sectional view illustrating a semiconductor device having a trench isolation layer according to an example embodiment.

Example embodiments are described below with reference to the accompanying drawings. Many different forms and embodiments are possible without deviating from the spirit and teachings of this disclosure and so the disclosure should not be construed as limited to the embodiments set forth herein. Rather, these embodiments are provided so that this disclosure will be thorough, and will convey a scope of the disclosure to those skilled in the art. In the drawings, the sizes and relative sizes of layers and regions may be exaggerated for clarity. The same reference numerals or the same reference designators denote the same elements throughout the specification.

Example embodiments are described herein with reference to cross-section illustrations that are schematic illustrations of embodiments (and intermediate structures). As such, variations from the shapes of the illustrations as a result, for example, of manufacturing techniques and/or tolerances, are to be expected. Thus, example embodiments may not be construed as limited to the particular shapes of regions illustrated herein but may be construed to include deviations in shapes that result, for example, from manufacturing.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "has", "having", "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross sectional view illustrating a semiconductor device having a trench isolation layer according to an example embodiment. Referring to FIG. 1, a semiconductor device 100 according to the present embodiment may be configured to include a substrate 110 having a trench 130 therein and a trench isolation layer 150 formed in the trench 130. The substrate 110 may be a silicon substrate but is not limited thereto. For example, the substrate 110 may be a silicon-on-insulator (SOI) substrate. The trench isolation layer 150 may define a plurality of active regions in and/or on which semiconductor elements such as transistors are disposed. That is, portions of the substrate 110, which are laterally adjacent to the trench isolation layer 150, may correspond to the active regions.

The trench isolation layer 150 may include a liner insulation layer 151, a first isolating insulation layer 153 and a second isolating insulation layer 155. The liner insulation layer 151 may be disposed to cover a bottom surface and sidewalls of the trench 130. A thickness (e.g., a horizontal width) of the liner insulation layer 151 on upper sidewalls of an upper region of the trench 130 may gradually increase as the liner insulation layer 151 extends toward a bottom surface of the trench 130, where the upper region of the trench 130 may extend to a first depth D1 from a top surface of the substrate 110. In addition, a thickness (e.g., a horizontal width) of the liner insulation layer 151 on lower sidewalls of the trench 130 may be uniform in a lower region of the trench 130. In an embodiment, the liner insulation layer 151 may include a nitride layer. A micro trench 152 (e.g., a micro void) may be disposed at each bottom inner corner of the liner insulation layer 151. That is, the micro trench 152 may be disposed at a location where the liner insulation layer 151 on the bottom surface of the trench 130 is in contact with the liner insulation layer 151 on the sidewalls of the trench 130. The micro trench 152 may be formed by partially etching the liner insulation layer 151 after deposition of the liner insulation layer 151.

The first isolating insulation layer 153 may be disposed to fill the micro trenches 152 and a lower region of the trench 130. A top surface of the first isolating insulation layer 153 may be coplanar with or lower than a horizontal level located at the first depth D1. That is, the first isolating insulation layer 153 may contact the liner insulation layer 151 at a level where the liner insulation layer 151 has a uniform thickness, and the first isolating insulation layer 153 may avoid contacting the sloped inner sidewalls of the liner insulation layer 151. The first isolating insulation layer 153 may include a high density plasma (HDP) oxide layer. The second isolating insulation layer 155 may completely fill the trench 130 on the first isolating insulation layer 153. The second isolating insulation layer 155 may include an ozone tetra-ethyl-ortho-silicate ($O_3$ TEOS) layer.

Figure 2:
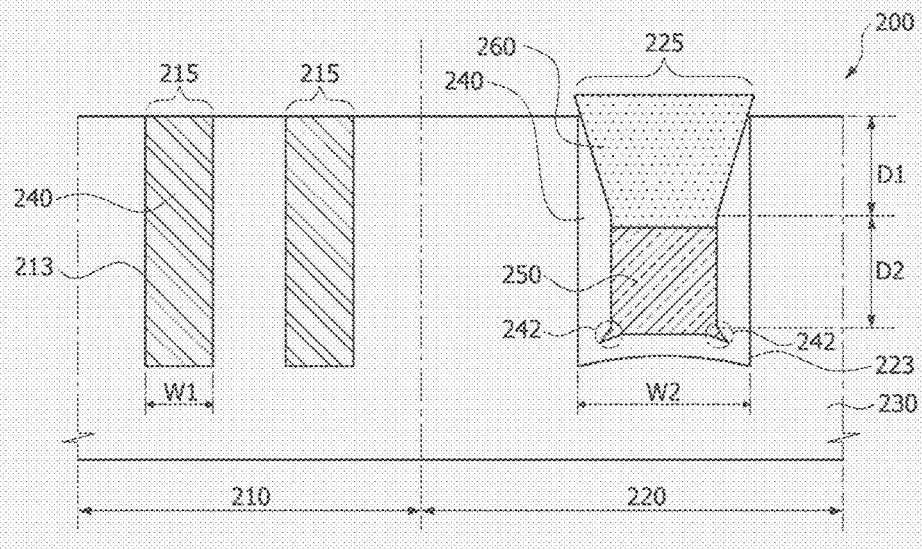
FIG. 2 is a cross sectional view illustrating a semiconductor device having a trench isolation layer according to another example embodiment.

FIG. 2 is a cross sectional view illustrating a semiconductor device having a trench isolation layer according to another example embodiment. Referring to FIG. 2, a semiconductor device 200 according to the present embodiment may include a substrate 230 having a first region 210 and a second region 220. The substrate 230 may be a silicon substrate but not limited thereto. For example, the substrate 230 may be a silicon-on-insulator (SOI) substrate. Portions of the substrate 230 may correspond to active regions in and/or on which semiconductor elements such as transistors are formed, and the active regions may be defined by a trench isolation layer. That is, some portions of the substrate 230, which are laterally adjacent to the trench isolation layer, may correspond to the active regions. The first region 210 and the second region 220 may correspond to a cell region and a peripheral circuit region, respectively. Thus, first trenches 213 having a relatively narrow width may be disposed in the first region 210, which may be a cell region of the substrate 230. A second trench 223 may be disposed in the second region 220, which may be a peripheral circuit region of the substrate 230. The second trench 223 may be wider than the first trench 213. First trench isolation layers 215 may be disposed in respective ones of the first trenches 213 to define active regions in the first region 210, and a second trench isolation layer 225 may be disposed in the second trench 223 to define active regions in the second region 220.

Each of the first trench isolation layers 215 may be a liner insulation layer 240 filling one of the first trenches 213 having a first width W1. The second trench isolation layer 225 may include the liner insulation layer 240, a first isolating insulation layer 250 and a second isolating insulation layer 260 that fill the second trench 223 having a second width W2. The liner insulation layer 240 constituting the second trench isolation layer 225 may be disposed to cover a bottom surface and sidewalls of the second trench 223. A thickness (e.g., a horizontal width) of the liner insulation layer 240 on upper sidewalls of an upper region of the second trench 223 may gradually increase as the liner insulation layer 240 extends toward a bottom surface of the second trench 223, where the upper region of the second trench 223 may extend to a first depth D1 from a top surface of the substrate 230. In addition, a thickness (e.g., a horizontal width) of the liner insulation layer 240 on lower sidewalls of the second trench 223 may be uniform in a lower region of the second trench 223, where the lower region of the second trench 223 has a depth between the first depth D1 and a second depth D2.

In an example embodiment, the liner insulation layer 240 may include a nitride layer. A micro trench 242 (e.g., a micro void) may be disposed at each bottom inner corner of the liner insulation layer 240 in the second trench 223. That is, the micro trench 242 may be disposed at a location where the liner insulation layer 240 on the bottom surface of the second trench 240 is in contact with the liner insulation layer 240 on the sidewalls of the second trench 240. The micro trench 242 may be formed by partially etching the liner insulation layer 240 after deposition of the liner insulation layer 240.

The first isolating insulation layer 250 may be disposed to fill the micro trenches 242 and a lower region of the second trench 223. A top surface of the first isolating insulation layer 250 may be coplanar with or lower than a horizontal level located at the first depth D1. That is, the first isolating insulation layer 250 may contact the liner insulation layer 240 at a level where the liner insulation layer 240 has a uniform thickness and may avoid contacting the sloped inner sidewalls of the liner insulation layer 240. The first isolating insulation layer 250 may include a high density plasma (HDP) oxide layer. The second isolating insulation layer 260 may completely fill the second trench 223 on the first isolating insulation layer 250. The second isolating insulation layer 260 may include an ozone tetra-ethyl-ortho-silicate ($O_3$ TEOS) layer.

Figure 3:
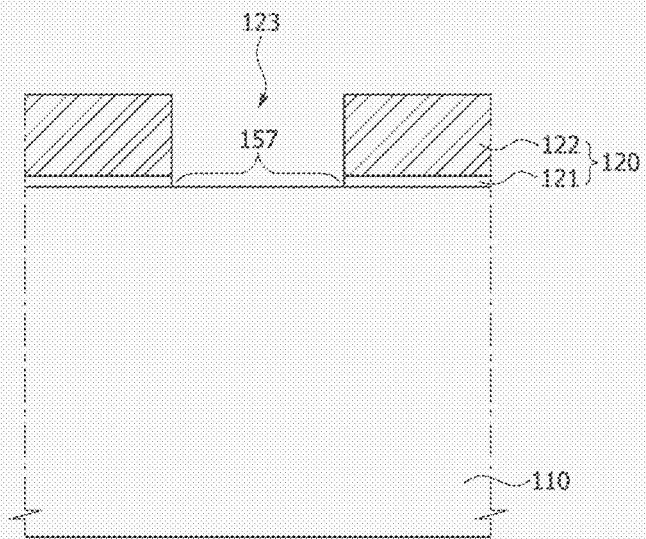
Figure 11:
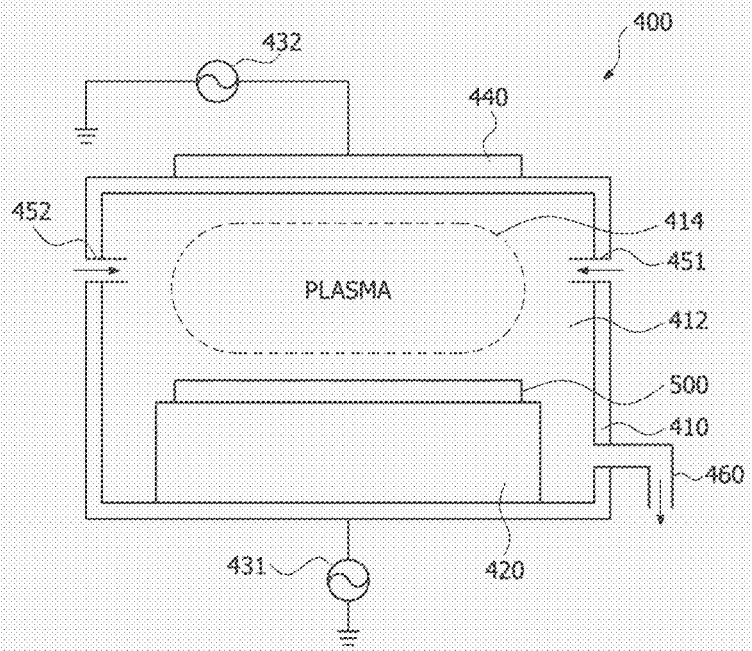
FIG. 11 is a schematic view illustrating a high density plasma (HDP) deposition apparatus used in formation of semiconductor devices having trench isolation layers according to some example embodiments.

FIGS. 3 to 10 are cross sectional views illustrating a method of fabricating a semiconductor device having a trench isolation layer of FIG. 1, and FIG. 11 is a schematic view illustrating a high density plasma (HDP) deposition apparatus used in formation of semiconductor devices having trench isolation layers according to some example embodiments. Referring to FIG. 3, an isolation mask pattern 120 may be formed on a substrate 110, for example, a silicon substrate. The isolation mask pattern 120 may be formed to have an opening 123 that exposes an isolation region 157 of the substrate 110. The isolation mask pattern 120 may be formed to include an oxide pattern 121 and a nitride pattern 122 which are sequentially stacked.

Figure 4:
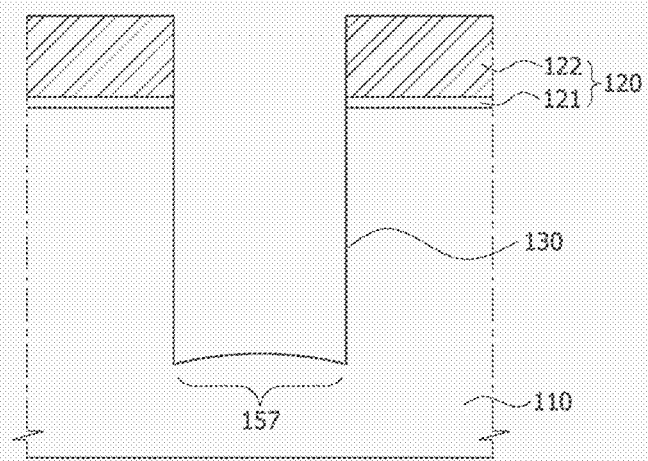

Referring to FIG. 4, the substrate 110 may be etched using the isolation mask pattern 120 as an etch mask, thereby forming a trench 130 having a certain depth in the isolation region 157 of the substrate 110. The trench 130 may be formed using a dry etching process. In an embodiment, the trench 130 may be formed to have an aspect ratio of about 4 or higher. The aspect ratio of the trench 130 may be defined as a ratio of a depth to a width thereof.

Figure 5:
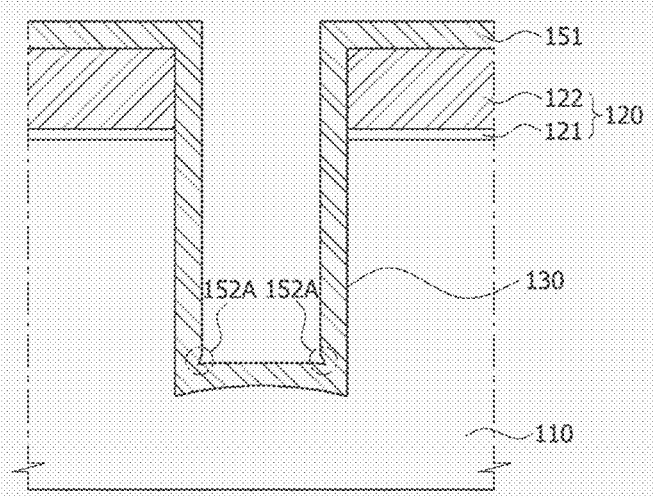

Referring to FIG. 5, a liner insulation layer 151 may be formed on an entire surface of the substrate including the trench 130. The liner insulation layer 151 may be formed of a nitride layer. If the trench 130 has an aspect ratio of 4 or more, it may be difficult to completely fill the trench 130 with a nitride layer even if a thickness of the nitride layer is increased. Thus, when the liner insulation layer 151 is formed of a nitride layer, the liner insulation layer 151 may be conformally formed to a certain thickness on an entire surface of the substrate including the trench 130. In this case, a seam 152A (e.g., a small empty space) may be formed at each of bottom inner corners of the liner insulation layer 151. That is, the seam 152A may be formed at a location that the liner insulation layer 151 on the bottom surface of the trench 130 is in contact with the liner insulation layer 151 on the sidewalls of the trench 130. This is because the liner insulation layer 151 exhibits poor step coverage when the liner insulation layer 151 is formed of a nitride layer.

Subsequently, the substrate including the liner insulation layer 151 may be loaded into a high density plasma (HDP) deposition apparatus 400 illustrated in FIG. 11. As illustrated in FIG. 11, the HDP deposition apparatus 400 may include a chamber 410 that defines a reaction space 412 therein. An electro-static chuck (ESC) 420 for supporting a wafer 500 may be disposed in the reaction space 412. The wafer 500 may correspond to the substrate including the liner insulation layer 151. The ESC 420 may be electrically connected to a radio frequency (RF) bias power supply 431 disposed outside the chamber 410. The RF bias power supply 431 may supply an RF bias to a backside surface of the wafer 500. A plasma source 440 may be disposed outside the chamber 410 and may be located on a top plate of the chamber 410. The plasma source 440 may generate plasma 414 in the reaction space 412 and on the wafer 500. The plasma source 440 may be a capacitively coupled plasma (CCP) source or an inductively coupled plasma (ICP) source. The plasma source 440 may be electrically connected to an RF source power supply 432 disposed outside the chamber 410. The RF source power supply 432 may supply RF source power to the plasma source 440.

Gas inlets 451 and 452 may be disposed at sidewalls of the chamber 410. Reaction gases may be introduced into the chamber 410 through the gas inlets 451 and 452. An exhaust line 460 may be disposed at a lower portion of the sidewall of the chamber 410. Byproduct and/or remaining gases in the chamber 410 may be vented through the exhaust line 460.

Figure 6:
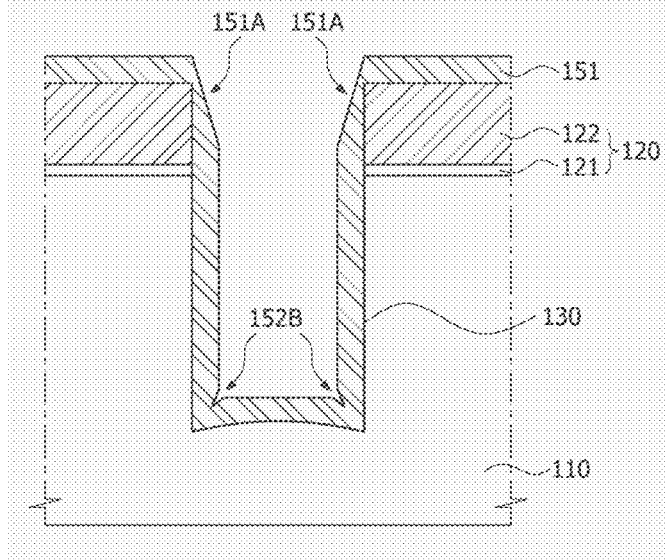

Referring to FIGS. 6 and 11, after the substrate including the liner insulation layer 151 is loaded into the HDP deposition apparatus 400, source power generated from the RF source power supply 432 may be applied to the plasma source 440. Further, a source gas, for example, an oxygen gas for forming an HDP oxide layer may be introduced into the chamber 410 through the gas inlets 451 and 452 while the source power from the RF source power supply 432 is applied to the plasma source 440. As a result, plasma 414 may be generated in the reaction space 412. Bias power from the RF bias power supply 431 may be then applied to the wafer 500 (e.g., the substrate including the liner insulation layer 151) through the ESC 420. In an initial step of the HDP deposition process, the RF bias power supply 431 may be controlled to generate a high bias power of about 1000 watts to about 2000 watts. Consequently, the HDP deposition apparatus 400 may perform an etching step rather than a deposition step. The initial etching step may be performed by an oxygen sputtering phenomenon. During the initial etching step, top corners 151A of the liner insulation layer 151 may be etched to provide a sloped and/or rounded profile. In addition, during the initial etching step, the liner insulation layer 151 adjacent to the seams (152A of FIG. 5) may also be etched. Thus, the seams 152A may be enlarged to form micro trenches 152B having a greater size than the seams 152A.

Referring to FIGS. 7 and 11, the bias power from the RF bias power supply 431 may then be changed to about 1500 watts to about 5000 watts. As a result, a first isolating insulation layer, for example, an HDP oxide layer 153A may be deposited on the wafer 500 while the initial etching step is performed. Accordingly, top corners 151B of the liner insulation layer 151 in the trench 130 may become more inclined such that a thickness (e.g., a horizontal width) of the liner insulation layer 151 on sidewalls of the trench 130 is increased toward a bottom surface of the trench 130. Further, the HDP oxide layer 153A may be deposited on the etched liner insulation layer 151 including the inclined top corners 151B. If the seams (152A of FIG. 5) are not enlarged, the HDP oxide layer 153A may not completely fill the seams 152A. However, since the seams 152A are enlarged to form the micro trenches 152B, the HDP oxide layer 153A may completely fill the micro trenches 152B.

As described above, the initial etching step (e.g., a sputter etching step) of the liner insulation layer 151 and the subsequent deposition step of the HDP oxide layer 153A may be sequentially and/or simultaneously performed. Thus, sidewalls of the liner insulation layer 151 covered by the HDP oxide layer 153A may remain un-etched. Accordingly, the inclined profile of the sidewalls of the liner insulation layer 151 may be provided in an upper trench having a certain depth (e.g., a first depth D1 and above) from a top surface of the substrate 110, and the liner insulation layer 151 in a lower trench having a depth between the first depth D1 and a second depth D2 may have a vertical sidewall profile. The HDP oxide layer 153A may also be deposited on the inclined sidewalls of the liner insulation layer 151 during the deposition step, as illustrated in FIG. 7. Thus, the liner insulation layer 151 in the upper trench may still have the inclined sidewall profile with a certain slope even after the deposition step.

Subsequently, the bias power of the RF bias power supply 431 may be alternately and repeatedly changed to have a first bias power of about 500 watts to about 1000 watts and a second bias power of about 900 watts to about 1500 watts, thereby repeatedly performing an etching step by the first bias power and a deposition step by the second bias power. The etching step by the first bias power and the deposition step by the second bias power may be repeatedly performed until the HDP oxide layer 153A fills at least the lower trench deeper than the first depth D1.

Referring to FIG. 8, after the HDP oxide layer (153A of FIG. 7) is formed, the substrate including the HDP oxide layer 153A may be unloaded from the HDP deposition apparatus (400 of FIG. 11). A cleaning process may be then performed to remove a portion of the HDP oxide layer 153A. The cleaning process may be performed using a wet cleaning technique. The HDP oxide layer 153A in the trench 130 may have a protrusion that protrudes upwardly from a top surface of the HDP oxide layer 153A. The cleaning process may remove the protrusion of the HDP oxide layer 153A formed in the trench 130 and a portion of the HDP oxide layer 153A deposited on the inclined top corners 151B of the liner insulation layer 151. As a result of the cleaning process, the HDP oxide layer 153A in the trench 130 may be deformed into a first isolating insulation layer 153 having substantially a flat top surface, and a shrunken HDP oxide layer 153B may remain on a top surface of the liner insulation layer 151 outside the trench 130. The shrunken HDP oxide layer 153B may be removed in a subsequent planarization process.

Referring to FIG. 9, after the protrusion is removed, a second isolating insulation layer, for example, an ozone ($O_3$) TEOS layer 155A may be deposited on the substrate including the first isolating insulation layer 153 and the shrunken HDP oxide layer 153B. The ozone ($O_3$) TEOS layer 155A may be formed under a pressure of about 300 torr to about 600 torr and at a temperature of about 400° C. to about 550° C. The ozone ($O_3$) TEOS layer 155A may be formed to fill the trench 130 on the first isolating insulation layer 153 (e.g., the HDP oxide layer remaining in the lower trench) and to cover the shrunken HDP oxide layer 153B. While the ozone ($O_3$) TEOS layer 155A is formed, a seam 155B may be formed over the trench 130 and a porous ozone ($O_3$) TEOS layer 155C may be formed around the seam 155B. This may be due to the inclined sidewall profile of the top corners 151B of the liner insulation layer 151. Subsequently, an annealing process may be applied to the substrate including the ozone ($O_3$) TEOS layer 155A, as indicated by arrows in FIG. 9.

Referring to FIG. 10, as a result of the annealing process, the porous ozone ($O_3$) TEOS layer 155C may be shrunk or densified and the seam 155B may be filled with the ozone ($O_3$) TEOS layer 155A which may include the densified ozone ($O_3$) TEOS layer 155C. The annealing process may be performed using a nitrogen gas or water vapor as an ambient gas at a temperature of about 700° C. to about 1000° C. Subsequently, the annealed ozone ($O_3$) TEOS layer 155A, the shrunken HDP oxide layer 153B, the liner insulation layer 151 and the isolation mask pattern 120 may be planarized until a top surface of the substrate 110 is exposed, thereby forming the trench isolation layer 150 illustrated in FIG. 1.

Figure 12:
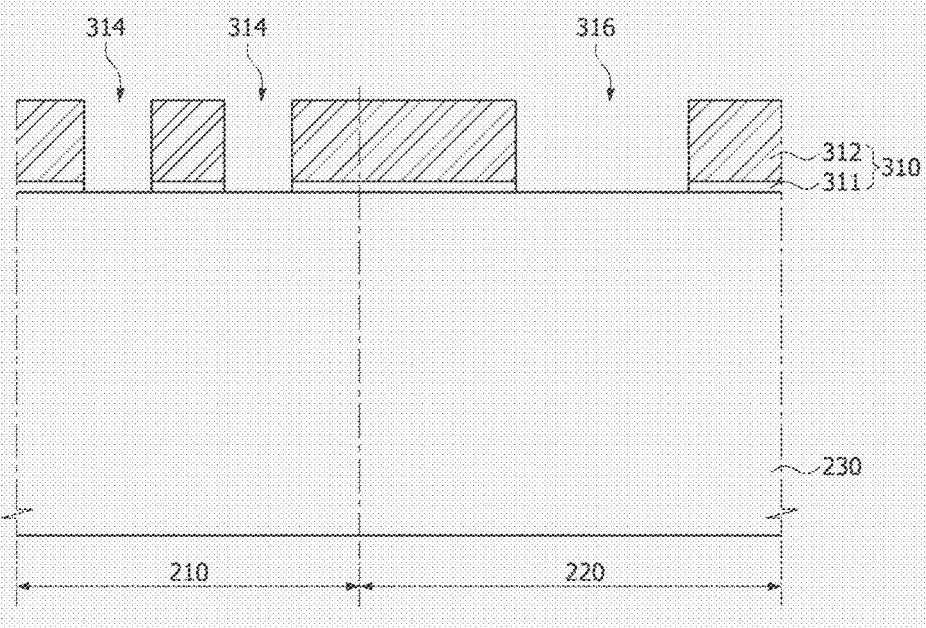

FIGS. 12 to 19 are cross sectional views illustrating a method of fabricating a semiconductor device having a trench isolation layer of FIG. 2. Referring to FIG. 12, an isolation mask pattern 310 may be formed on a substrate 230 having a first region 210 and a second region 220. In an embodiment, the substrate 230 may be a silicon substrate. The first region 210 and the second region 220 may be a cell region and a peripheral circuit region, respectively. Patterns formed in the first region 210 may have the same minimum line width as patterns formed in the second region 220. However, in some embodiments, the patterns formed in the first region 210 may have a different minimum line width than the patterns formed in the second region 220. For example, the patterns in the first region 210 may have a minimum feature size (MFS) which is less than that of the patterns in the second region 220. This design rule may be applicable to isolation layers that are formed in the first region 210 and the second region 220 of the substrate 230 to define active regions. That is, the isolation mask pattern 310 in the first region 210 may be formed to have first openings 314 that expose relatively narrow isolation regions, whereas the isolation mask pattern 310 in the second region 220 may be formed to have a second opening 316 that exposes a relatively wide isolation region. The isolation mask pattern 310 may be formed to include an oxide pattern 311 and a nitride pattern 312 which are sequentially stacked.

Referring to FIG. 13, the substrate 230 may be etched using the isolation mask pattern 310 as an etch mask, thereby forming first trenches 213 in the substrate 230 of the first region 210 and a second trench 223 in the substrate 230 of the second region 220. The first and second trenches 213 and 223 may be formed using a dry etching process. The first trenches 213 may be formed to have higher aspect ratios than the second trench 223. According to an embodiment, both the first trenches 213 and the second trench 223 may be formed to have aspect ratios of about 4 or higher.

Referring to FIG. 14, a liner insulation layer 240 may be formed on an entire surface of the substrate including the first and second trenches 213 and 223. The liner insulation layer 240 may be formed of a nitride layer. As described above, the first trenches 213 may be formed to have higher aspect ratios than the second trench 223. Thus, the first trenches 213 may be filled with the liner insulation layer 240 (e.g., a nitride layer), whereas a portion of the second trench 223 may remain unfilled with the liner insulation layer 240 (e.g., a nitride layer). That is, the liner insulation layer 240 in the second region 220 may be conformally formed to a certain thickness on a bottom surface and sidewalls of the second trench 223 as well as on a surface of the isolation mask pattern 310. Thus, a seam 242A (e.g., a small empty space) may form at each of bottom inner corners of the liner insulation layer 240 in the second trench 223. That is, the seam 242A may be formed at a location where the liner insulation layer 240 on the bottom surface of the second trench 223 is in contact with the liner insulation layer 240 on the sidewalls of the second trench 223. The seams 242 may form because the liner insulation layer 240, for example, a nitride layer exhibits a poor step coverage. Subsequently, the substrate including the liner insulation layer 240 may be loaded into the HDP deposition apparatus 400 described with reference to FIG. 11.

Referring to FIGS. 15 and 11, after the substrate including the liner insulation layer 240 is loaded into the HDP deposition apparatus 400, source power generated from the RF source power supply 432 may be applied to the plasma source 440. Further, a source gas, for example, an oxygen gas for forming an HDP oxide layer may be introduced into the chamber 410 through the gas inlets 451 and 452 while the source power from the RF source power supply 432 is applied to the plasma source 440. As a result, plasma 414 may be generated in the reaction space 412. Bias power from the RF bias power supply 431 may then be applied to the wafer 500 (e.g., the substrate including the liner insulation layer 240) through the ESC 420. In an initial step of the HDP deposition process, the RF bias power supply 431 may be controlled to generate a high bias power of about 1000 watts to about 2000 watts. Thus, the HDP deposition apparatus 400 may perform an etching step rather than a deposition step. The initial etching step may be performed by an oxygen sputtering phenomenon. During the initial etching step, top corners 240A of the liner insulation layer 240 in the second trench 223 may be etched to provide a sloped and/or rounded profile. In addition, during the initial etching step, the liner insulation layer 240 adjacent to the seams (242A of FIG. 14) may also be etched. Thus, the seams 242A may be enlarged to form micro trenches 242B having greater sizes than the seams 242A.

Referring to FIGS. 16 and 11, the bias power from the RF bias power supply 431 may be then changed to about 1500 watts to about 5000 watts. As a result, a first isolating insulation layer, for example, an HDP oxide layer 250A may be deposited on the wafer 500 while the initial etching step is still performed. Accordingly, top corners 240B of the liner insulation layer 240 in the second trench 223 may become more inclined such that a thickness (e.g., a horizontal width) of the liner insulation layer 240 on sidewalls of the second trench 223 is increased toward a bottom surface of the second trench 223. Further, the HDP oxide layer 250A may be deposited on the etched liner insulation layer 240 including the inclined top corners 240B. If the seams (242A of FIG. 14) are not enlarged, the HDP oxide layer 250A may not completely fill the seams 242A. However, since the seams 242A are enlarged to form the micro trenches 242B in the initial etching step, the HDP oxide layer 250A may completely fill the micro trenches 242B.

As described above, the initial etching step (e.g., a sputter etching step) of the liner insulation layer 240 and the deposition step of the HDP oxide layer 250A may be sequentially and/or simultaneously performed. Thus, sidewalls of the liner insulation layer 240 covered by the HDP oxide layer 250A may remain un-etched. Accordingly, the inclined sidewall profile of the liner insulation layer 240 may be provided only in an upper region of the second trench 223 having a first depth D1 from a top surface of the substrate 230, and the liner insulation layer 240 in a lower region of the second trench 223 having a depth below the first depth D1 to a second depth D2 may have a vertical sidewall profile. The HDP oxide layer 250A may also be deposited on the inclined sidewalls 240B of the liner insulation layer 240 during the deposition step, as illustrated in FIG. 16. Thus, the liner insulation layer 240 in the upper trench may still have the inclined sidewall profile with a certain slope even after the deposition step.

Subsequently, the bias power of the RF bias power supply 431 may be alternately and repeatedly changed to have a first bias power of about 500 watts to about 1000 watts and a second bias power of about 900 watts to about 1500 watts, thereby repeatedly performing an etching step by the first bias power and a deposition step by the second bias power. The etching step by the first bias power and the deposition step by the second bias power may be repeatedly performed until the HDP oxide layer 250A fills at least the lower trench deeper than the first depth D1.

Referring to FIG. 17, after the HDP oxide layer (250A of FIG. 16) is formed, the substrate including the HDP oxide layer 250A may be unloaded from the HDP deposition apparatus (400 of FIG. 11). A cleaning process may then be performed to remove a portion of the HDP oxide layer 250A. The cleaning process may be performed using a wet cleaning technique. The HDP oxide layer 250A in the second trench 223 may have a protrusion that protrudes upwardly from a top surface thereof. The cleaning process may remove the protrusion of the HDP oxide layer 250A formed in the second trench 223 and a portion of the HDP oxide layer 250A deposited on the inclined top corners 240B of the liner insulation layer 240. As a result of the cleaning process, the HDP oxide layer 250A in the second trench 223 may be deformed into a first isolating insulation layer 250 having substantially a flat top surface, and a shrunken HDP oxide layer 250B may remain on a top surface of the liner insulation layer 240 outside the second trench 223. The shrunken HDP oxide layer 250B may be removed in a subsequent planarization process.

Referring to FIG. 18, a second isolating insulation layer, for example, an ozone ($O_3$) TEOS layer 260A may be deposited on the substrate including the first isolating insulation layer 250 and the shrunken HDP oxide layer 250B. The ozone ($O_3$) TEOS layer 260A may be formed under a pressure of about 300 torr to about 600 torr and at a temperature of about 400° C. to about 550° C. The ozone ($O_3$) TEOS layer 260A may be formed to fill the second trench 223 on the first isolating insulation layer 250 (e.g., the HDP oxide layer remaining in the lower trench) and to cover the shrunken HDP oxide layer 250B. While the ozone ($O_3$) TEOS layer 260A is formed, a seam 260B may be formed over the second trench 223 and a porous ozone ($O_3$) TEOS layer 260C may be formed around the seam 260B. This may be due to the inclined sidewall profile of the top corners 240B of the liner insulation layer 240. Subsequently, an annealing process may be applied to the substrate including the ozone (O₃) TEOS layer 260A, as indicated by arrows in FIG. 18.

Referring to FIG. 19, as a result of the annealing process, the porous ozone (O₃) TEOS layer 260C may be shrunk or densified and the seam 260B may be filled with the ozone (O₃) TEOS layer 260A which may include the densified ozone (O₃) TEOS layer 260C. The annealing process may be performed using a nitrogen gas or water vapor as an ambient gas at a temperature of about 700° C. to about 1000° C. Subsequently, the annealed ozone (O₃) TEOS layer 260A, the shrunken HDP oxide layer 250B, the liner insulation layer 240 and the isolation mask pattern 310 may be planarized until a top surface of the substrate 230 is exposed, thereby forming the first trench isolation layers 215 in the first region 210 and the second trench isolation layer 225 in the second region 220, as illustrated in FIG. 2.

According to the embodiments set forth above, a trench isolation layer can be formed without use of a spin on dielectric (SOD) layer or a flowable insulation layer, thereby minimizing the stress generated in a subsequent annealing process. Further, according to the disclosed embodiments, the trench isolation layer may be formed of an insulation layer that does not contain impurities such as carbon hydride (CH) or nitrogen hydride (NH). Thus, even though the trench isolation layer is densified in a subsequent annealing process, the generation of impurities such as carbon hydride (CH) or nitrogen hydride (NH) may be avoided, thus preventing degradation of a device isolation characteristic.

The embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor device including a trench isolation layer, the semiconductor device comprising:
    a substrate having a first trench and a second trench wider than the first trench;
    a liner insulation layer filling the first trench, covering a bottom surface and sidewalls of the second trench, and including micro trenches located at bottom inner sidewall corners of the liner insulation layer in the second trench, the liner insulation layer on sidewalls of an upper region of the second trench having a thickness that gradually increases toward a bottom surface of the second trench and the liner insulation layer on sidewalls of a lower region of the second trench having a thickness that is uniform;
    a first isolating insulation layer completely filling the micro trenches located in the sidewall corner of the liner insulation layer and the lower region of the second trench that are surrounded by the liner insulation layer; and
    a second isolating insulation layer filling the second trench on the first isolating insulation layer.

2. The semiconductor device of claim 1, wherein the first trench is disposed in a cell region of the substrate and the second trench is disposed in a peripheral circuit region of the substrate.

3. The semiconductor device of claim 1, wherein the liner insulation layer includes a nitride layer.

4. The semiconductor device of claim 1, wherein a top surface of the first isolating insulation layer is located in the lower region of the second trench.

5. The semiconductor device of claim 1, wherein the first isolating insulation layer includes a high density plasma (HDP) oxide layer.

6. The semiconductor device of claim 1, wherein the second isolating insulation layer includes an ozone tetra-ethyl-ortho-silicate (O₃ TEOS) layer.

* * * * *